United States Patent [19]

Evans

[11] 4,380,943
[45] Apr. 26, 1983

[54] AUTOMATED CUT-TO-MARK CONTROL FOR CUT-OFF MACHINE

[75] Inventor: Donald J. Evans, Cherry Hill, N.J.

[73] Assignee: Molins Machine Company, Inc., Cherry Hill, N.J.

[21] Appl. No.: 265,509

[22] Filed: May 20, 1981

[51] Int. Cl.³ .................. B26D 5/34; B26D 5/36; G05B 19/29

[52] U.S. Cl. .................................. 83/38; 83/76; 83/288; 83/298; 83/303; 83/372

[58] Field of Search .................. 83/37, 38, 74, 75, 76, 83/288, 289, 298, 303, 372

[56] References Cited

U.S. PATENT DOCUMENTS

Re. 30,628  5/1981  Tokuno .
3,730,810  5/1973  Klein .
3,858,052  12/1974  Luska .
4,170,155  10/1979  Saito et al. .
4,287,797  9/1981  Seragnoli .......................... 83/74

Primary Examiner—James M. Meister
Attorney, Agent, or Firm—Seidel, Gonda, Goldhammer & Panitch

[57] ABSTRACT

At a transition between first and second sets of registration marks on a web, a target is applied adjacent the initial mark of the second set. The target is sensed and tracked electronically to a shear station. During an order change or a roll-to-roll change within an order, the web is automatically severed transversely by the shear at the transition between the sets of marks, and the target is tracked to a station intermediate the shear and the cut-off machine. The cut-off machine knives "crop" cut the web at the target and thereafter cut the web automatically in synchronization with the second set of marks. Operation of the cut-off machine knives in the cut-to-mark mode is maintained without loss of synchronization across the transition in the web. Operator intervention is eliminated, and scrap is minimized.

11 Claims, 9 Drawing Figures

AUTOMATED CUT-TO-MARK CONTROL FOR CUT-OFF MACHINE

BACKGROUND OF THE INVENTION

The invention is related to the automation of direct drive cut-off knives having cut-to-mark control. A direct drive cut-off machine is one in which the cyclic speeds of the cut-off knives are electronically controlled. The knives cut a continuous web of pre-printed corrugated board into sheets or "blanks".

In particular, this invention is related to the control of such knives to effect automatic order change and/or automatic synchronization of the knives to the registration marks following a transition in the web such as a splice. The knives cut the web at or in reference to the registration marks which are spaced corresponding to the desired sheet length.

The knives are slaved to an optical sensor, which detects presence or absence of the registration marks, and a logic control which synchronizes the knives to the registration marks so as to cut the web at or in specific relation to the registration marks. The logic control periodically enables the optical sensor to scan a narrow portion of the web edge for a registration mark over a short period of time known in the art as a "window". The "window" is intended to prevent the optical sensor from producing spurious signals caused by pre-printed material or blemishes on the web which might otherwise be mistakenly identified as a registration mark.

Heretofore, operating in the cut-to-mark mode, intervention by an operator was necessary when the web was formed of one or more webs connected by a splice and either (1) a roll-to-roll change had occurred within an order wherein the spacing between registrations marks was preserved on both sides of the splice but the spacing between marks was lost across the splice, or (2) an order change was required wherein the spacing between registration marks changed from one order to another across the splice, requiring the cut-off knives to cut sheets of different lengths on each side of the splice.

Operator intervention is necessitated when there has been an order change or a roll-to-roll change within an order because the cut-off knives will normally not be in synchronization with the registration marks of the web following the splice. The registration marks following the splice do not appear in the optical sensor "windows" generated by the logic control since the "windows" are generated based on the spacing between marks preceding the splice. The operator must depress an upstream or downstream adjust button to cause the logic control to synchronize the knives to the registration marks on the web following the splice. This manual adjustment is time consuming and results in the temporary cutting of sheets of improper length, producing scrap and an exceptionally long sheet which may obstruct the sheet-stacking mechanism.

In addition, for an order change it is necessary to sever the web at the splice to separate the old and new orders, and for a roll-to-roll change it is necessary to sever the web at the splice to permit the cut-off knives enough time to "cock" in preparation for the first cut of the new roll web. Severance of the web must be initiated manually. The operator observes the splice as it approaches the shear and presses a button to fire a shear control which causes the shear knives to sever the web. Typically, a splice is missed by several feet using this technique, resulting in wasted board.

The present invention obviates (1) an operator-initiated upstream or downstream adjust for an order change or a roll-to-roll change, and (2) manual-initiated firing of the shear, in the cut-to-mark mode.

The present invention automates synchronization of the cut-off knives with the registration marks of the web following the splice in a manner that minimizes scrap and reduces the possibility of an exceptionally long scrap sheet which obstructs the sheet-stacking mechanism.

SUMMARY OF THE INVENTION

The present invention is directed to method and apparatus of automatically controlling a cut-off machine which cuts a preprinted web having a transition such as a splice between first and second sets of registration marks.

A target capable of being sensed is applied to the web adjacent the initial registration mark of the second set upstream of the transition. The moving web is cut by the cut-off machine knives in synchronization with the registration marks of the first set downstream of the transition. The target is sensed when it appears at a station upstream of the cut-off machine.

The target is tracked to the shear station upstream of the cut-off machine, and the shear is operated automatically to sever the web transversely into a leader and trailer. The first set of registration marks appears on the leader; and the second set together with the target appears on the trailer. The target is then tracked to a second station, between the shear and the cut-off machine, and the logic control then tracks the target from that position to the cut-off machine. When the target appears at the cut-off machine, the cut-off knives are operated to "crop" cut the trailer at the target, that is, adjacent the initial registration mark on the trailer. Thereafter, the cut-off knives cut the trailer in synchronization with the trailer registration marks, i.e., in the cut-to-mark mode.

An object of the invention is to automate a cut-off machine to preserve synchronization between the cut-off knives and registration marks across a transition in the web in a manner which is simple, inexpensive and reliable.

Another object of the invention is to automate a cut-off machine to effect an automatic order change while operating the machine in the cut-to-mark mode.

Other objects and advantages will appear hereinafter.

For the purpose of illustrating the invention, there is shown in the drawing a form which is presently preferred; it being understood, however, that this invention is not limited to the precise arrangements and instrumentalities shown.

DETAILED DESCRIPTION OF THE INVENTION

Figure 1:
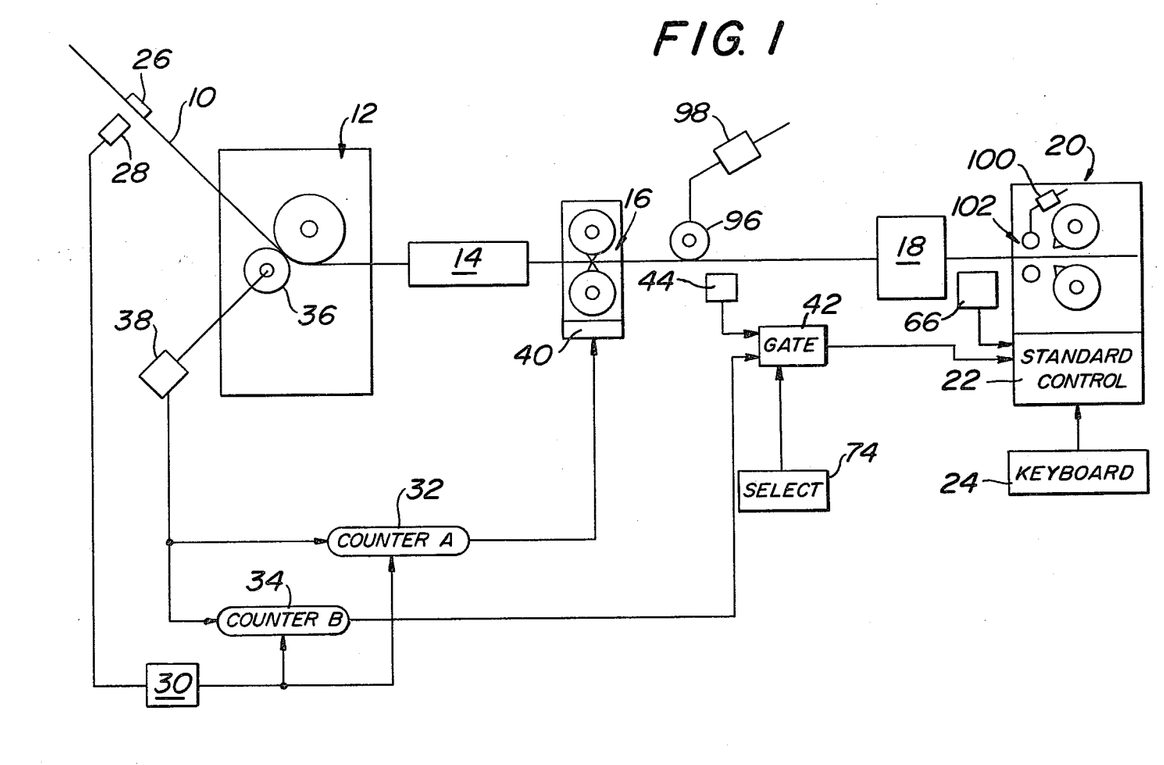
FIG. 1 is a block diagram of the invention.

Referring to the drawings in detail, wherein like numerals indicate like elements, there is shown in FIG. 1 a portion of a corrugator which processes a moving web of corrugated paperboard 10.

Conventional Elements Of The Corrugator

The corrugator includes a glue machine 12 upstream of a double facer machine 14. Downstream of the double facer machine 14, there is provided a rotary shear 16 for severing the web, a slitter-scorer 18 for slitting and scoring the web in known manner, and a cut-off machine 20. The cut-off machine has rotary knives controlled by a standard logic control 22 connected to an input keyboard 24. The cut-off machine and logic control 22 cut the web into blanks of desired lengths based on the keyboard inputs. The cut-off machine 20 is the type known in the industry as a type B cut-off machine, such as the Reliance machine which has (1) cut-to-length capability with automated order change, and (2) cut-to-mark capability with manual-initiated order change only and with loss of synchronization across a transition in the web such as a gap or a splice.

The present invention is directed to a technique of operating the shear 16 and actuating the logic control 22 to fully automate the cut-off machine 20 in the cut-to-mark mode.

Prior Art Order Change: Cut-To-Length And Cut-To-Mark Operation Of Type B Machine For the reader's convenience, the following summary of operation of cut-off machine 20 is provided in connection with automated order change cut-to-length operation and manual-initiated order change cut-to-mark operation. Details of operation of the machine are well-known in the industry.

Cut-To-Length Order Change

A. "Crop" Cutting The Trailer

Figure 2A:
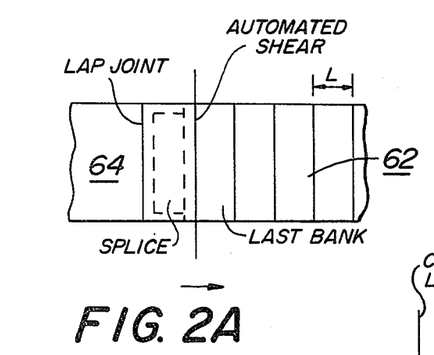
FIGS. 2A and 2B are diagrammatic views of a moving web having spliced portions which is severed by a shear and cut into blanks by the cut-off machine in conventional manner in the cut-to-length mode.
Figure 2B:
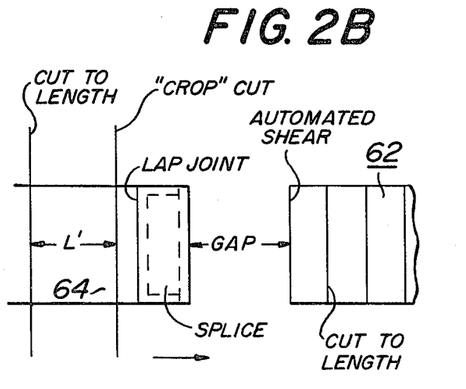
Figure 3A:
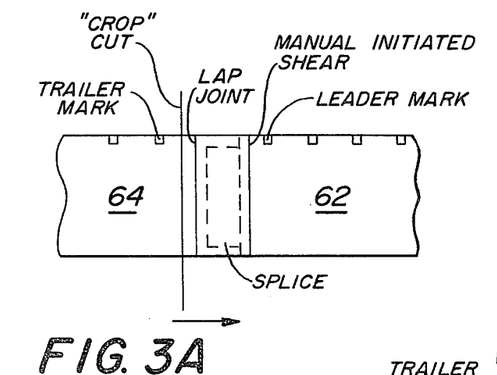
FIGS. 3A and 3B are diagrammatic views of a moving web having spliced pre-printed portions bearing registration marks which is severed by the shear and cut into blanks by the cut-off machine in conventional manner in the cut-to-mark mode.
Figure 3B:
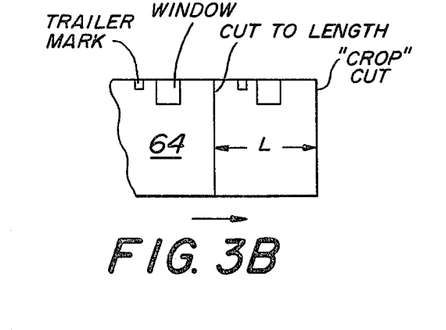

For cut-to-length order change, the control 22 automatically fires the shear 16, by a technique described hereafter, causing the shear to sever the web so as to divide the web into a leader 62 and trailer 64. See FIGS. 2A and 2B. Old order blanks are cut from the leader, and new order blanks are cut from the trailer. The electrical connection between control 22 and shear 16 is not shown in FIG. 1 for purposes of simplicity and since the connection is not used in practicing the present invention.

A measuring wheel 96 and encoder 98 located between the shear 16 and photoelectric cell 44 provide a pulse stream indicative of trailer displacement. An encoder 100 connected to the cut-off machine pull rolls 102 provide a pulse stream indicative of leader displacement. The photoelectric cell 44 is connected directly to the control 22. The cell detects the trailing edge of the leader 62 and triggers the control 22 to cause the control to track the trailing edge of the leader to the cut-off machine by initiating a count of the pull roll encoder pulses. When the count reaches the known distance A between the cell 44 and cut-off machine 20, indicating that the trailing edge of the leader has reached the cut-off machine, control 22 "cocks" the cut-off knives. The knives remain "cocked" in anticipation of receiving the trailer 64.

The photocell also detects the leading edge of the trailer 64 and triggers the control 22 to track the leading edge of the trailer to the cut-off machine by initiating a count of the measuring wheel encoder pulses. When the count of measuring wheel encoder pulses reaches the known distance A between the cell 44 and cut-off machine 20, the control 22 operates the cut-off knives to "crop" cut the leading edge of the trailer 64. The "crop" cut is the first cut of the trailer 64, and it is made to clean up the relatively imprecise, ragged leading edge of the trailer resulting from the shear cut. See FIG. 2B.

When the "crop" cut is made, the control 22 initiates another count of measuring wheel encoder pulses. When that count reaches the desired blank length L' for the new order, as input at the keyboard 24, the control 22 operates the cut-off knives to again cut the web. This produces the first new order blank of length L'. This operation of the cut-off knives by control 22 is repeated throughout the new order and is termed "cut-to-length".

B. Firing The Shear

As indicated above, the shear 16 is automatically fired by control 22 to sever the web during an order change. Actually, the shear 16 is operated to sever the web at the end of the last blank in the old order, i.e. at the end of the last blank in what is to become the leader 62. See FIG. 2A. At start-up, prior to any order change, the leading edge of the leader 62 moves towards the cut-off machine 20 and traverses the cell 44. At this time, control 22 computes the position of the end of the last blank relative to the cut-off machine 20 based on the desired blank length L for blanks cut from the leader or old order, the number n of blanks to be cut in the order, and the known separation A between the cell 44 and the cut-off machine 20. Specifically, the position P of the end of the last blank upstream of the cut-off machine 20 when the leading edge of leader 62 traverses the cell 44 is:

$$P = A + L \times n$$

When the leading edge of the leader 62 traverses cell 44, the cell triggers control 22. The control initiates a count of the measuring wheel encoder pulses to track the end of the last blank in the order from the position P to the shear 16. When the count reaches the known separation S between the shear 16 and cut-off machine 20, the control 22 fires the shear, and the shear severs the web at the end of the last blank in the order.

Thereafter, a gap is created between the leader and trailer, for example by speeding up the leader in conventional manner. See FIG 2B. As the gap traverses the cut-off machine 20, the cut-off machine is said to be "in the gap" and the machine remains in the cut-to-length mode with the cut-off knives "cocked". The cut-off machine 20 "crop" cuts the trailer 64 as previously described and continues to operate in the cut-to-length mode based on the new desired blank length L'.

From the foregoing, it can be appreciated that there are two aspects of operation of the cut-off machine 20 during an order change in the cut-to-length mode: (1) firing the shear to sever the web at the end of the last blank in the old order, and (2) operating the cut-off knives to "crop" cut the trailer and then continue to cut the trailer in the cut-to-length mode after the shear has been fired to sever the web.

Cut-To-Mark Order Change

A. Manual-Initiated Shear

For cut-to-mark operation, the web 10 is provided with printed indicia and registration marks to enable blanks of the desired length to be cut from the web such that each blank bears the same printed indicia. For the B type cut-off machine 20, the control 22 cannot fire the shear to effect an automated order change in the cut-to-mark mode, and synchronization between the cut-off knives and web registration marks cannot be maintained from the leader 62 to the trailer 64. Thus, the shear must be fired in response to a manually initiated command, and an upstream or downstream adjust is required to synchronize the cut-off knives to the trailer registration marks.

B. Optical Sensor "Windows"

An optical sensor 66, located at least one cut-off knife circumference from cut-off machine 20, is periodically enabled by control 22 to scan a finite portion of the web order for registration marks over a time "window". The dimensions of the "window" may vary. Typically, the "window" extends a minimum of two inches upstream and two inches downstream of a registration mark. The registration marks typically have a width of 0.25 inch along the web edge and the length of 6 inches transverse of the web. The location of the registration marks is preferably along an edge of the web 10, but the marks may be located in the central portion of the web if desired.

While the leader 62 passes through the cut-off machine 20, the cut-off knives are operated by control 22 to cut the leader at the leader registration marks in the cut-to-mark mode. When the trailing edge of the leader is tracked to the cut-off machine 20, the control 22 "cocks" the cut-off knives. Before the trailer 64 reaches the optical sensor, while the cut-off machine 20 is "in the gap", the cut-off knives remain "cocked". When the leading edge of the trailer eventually reaches cell 44, the cell 44 triggers the control 22 as previously described. The control 22 then tracks the leading edge of the trailer from the cell to the cut-off machine 20 which "crop" cuts the leading edge of the trailer in the cut-to-length mode. See FIG. 2B.

C. Upstream Or Downstream Adjust

To bring the cut-off machine 20 into cut-to-mark operation following the "crop" cut, whereby the cut-off knives cut the trailer in response to detection of registration marks in the optical sensor "windows", it is necessary for the operator to manually depress an upstream or downstream adjust button. During an upstream or downstream adjust operation, the optical sensor "window" is advanced or delayed by the control 22 until it first coincides with a registration mark. That is, the optical sensor "window" is displaced in time until it coincides with the passage of a registration mark across the optical sensor. In the cut-to-length mode, the optical sensor "windows" are generated by control 22, based on the count of measuring wheel encoder pulses and the keyboard entry of blank length L', just prior to each cut of the cut-off knives. At the first coincidence of a registration mark and "window", the control 22 initiates a count of the measuring wheel encoder pulses. The next "window" is generated while the cut-off knives are still operating in the cut-to-length mode, and if that "window" coincides with the next registration mark the control 22 computes the separation between the two "windows" in terms of measuring wheel encoder pulses and uses that number to periodically enable the optical sensor thereafter. The cut-off knives are then operated by control 22 to cut the web in response to detection of each registration mark in a "window", and the cut-off machine is said to operate in the "cut-to-mark" mode.

From the foregoing, it can be appreciated that there are three deficiencies in operation of the cut-off machine 20 during an order change in the cut-to-mark mode: (1) the shear 16 must be fired manually to sever the web, (2) the cut-off knives initially "crop" cut the leading edge of the trailer but are not in synchronization with the trailer registration marks, and (3) a manually initiated adjust is necessary to bring the cut-off machine into cut-to-mark operation on the trailer.

The Invention

The present invention is directed to an automated control wherein the cut-off machine 20 is operated without loss of synchronization in the cut-to-mark mode despite a transition in registration marks on the web such as would occur across a splice, including: (1) synchronizing the cut-off machine and shear for automated shear operation, and (2) "crop" cutting the trailer at the first registration mark and eliminating the manual-initiated upstream or downstream adjust.

A. Automated Order Change

Figure 4A:
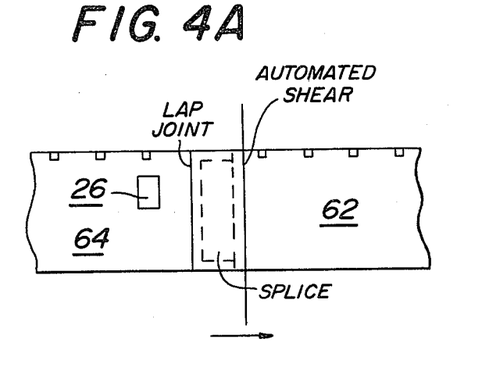
FIGS. 4A and 4B are diagrammatic views of a moving web having spliced pre-printed portions which is severed by the shear automatically and cut into blanks by the cut-off machine in the cut-to-mark mode without loss of synchronization in accordance with the present invention.

In the preferred embodiment of the invention, a target 26 is applied to the web 10 in alignment with the initial registration mark of the second set following the transition between first and second sets of marks on the web. See FIG. 4A. The transition occurs at a splice between webs 62 and 64 effected by adhesive tape or the like. The target 26 is preferably a magnetically detectable tape such as a metallic tape but it may have other forms. The target 26 is sensed by a magnetic sensor 28 which causes a pulse generator 30 to enable a pair of counters 32 and 34. A measuring wheel 36 is driven by the web 10 and is connected to an encoder 38. The measuring wheel and encoder are well-known devices which provide a pulse stream indicative of web travel. The pulses generated by the encoder 38 are counted by counters 32 and 34 to track the target as described hereafter.

Figure 4B:
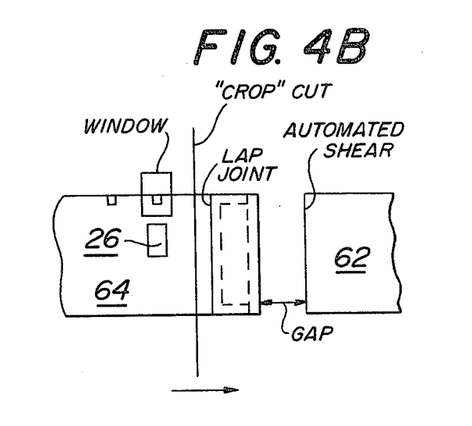

Magnetic sensor 28 and measuring wheel 36 are located at stations upstream of and at predetermined web distances from the cut-off machine 20 and shear 16. Counter 32 is preset to the web distance between the magnetic sensor 28 and shear 16. The counter tracks the target 26 to the shear 16 by counting the measuring wheel encoder pulses. When counter 32 counts out, the predicted position of the target 26 is at the shear. A shear fire control signal is generated by counter 32 at this time to cause a shear fire control 40 to automatically activate the shear knives. The shear knives sever the web 10 immediately downstream of the splice. See FIG. 4A. The cut made by the shear 16 is imprecise and ragged but it does separate the web 10 into a leader 62 and trailer 64. The trailer has the target 26 thereon. A gap is formed between the leader and trailer in a known manner to permit adjustment of the slitter-scorer 18 and cut-off machine 20 for the new order before the trailer 64 reaches either device. See FIG. 4B.

Initially, control 22 causes the cut-off knives to cut the leader 62 in the cut-to-mark mode. When the cut-off machine 20 is "in the gap", however, the cut-off knives are "cocked". As previously explained, this is a conventional feature of the control 22.

Counter 34 is preset to the web distance between the magnetic sensor 28 and the cell 44. The counter 34 tracks the target 26 to the cell 44 by counting the measuring wheel encoder pulses. When counter 34 counts out, the predicted position of target 26 is at the cell 44 and tracking signal is transmitted by the counter through a logic gate 42 to the control 22. The cell 44, which is conventionally used to trigger the control 22 in the cut-to-length mode is blocked by the gate 42.

Gate 42 may be any suitable electronic logic gate conditioned by a manually operable two sttate select switch 74. In one state, corresponding to conventional cut-to-length operation, switch 74 enables gate 42 to pass the output of cell 44 while blocking the output of counter 34. In the other state, corresponding to cut-to-mark operation according to the present invention, switch 74 enables gate 42 to pass the output of counter 34 while blocking the ouput of cell 44.

In the cut-to-mark mode as selected by switch 74, the tracking signal from counter 34 is passed by gate 42 to trigger control 22 which now tracks the target 26, rather than the leading edge of the trailer, from the position of cell 44 to the cut-off machine 20. The control 22 then causes the cut-off knives to "crop" cut the trailer at the target 26, adjacent the first registration mark on the trailer. See FIG. 4B. Thus, the knives do not "crop" cut the leading edge of the trailer but, instead, "crop" cut the trailer at the first registration mark itself. Since the target 26 is applied adjacent the first registration mark, the mark will appear in the optical sensor "window" immediately prior to the "crop" cut. Thereafter, the cut-off knives will operate in synchronization with all remaining registration marks on the trailer, that is, the knives will cut the trailer in the cut-to-mark mode under control of logic control 22.

From the foregoing, it can be appreciated that the existing logic control 22 associated with cut-off machine 20 is designed to track the leading edge of the trailer between cell 44 and the cut-off machine 20 based on a count of measuring wheel encoder pulses; and it is designed to cause the cut-off knives to "crop" cut the leading edge of the trailer. Tracking of the leading edge of the trailer by control 22 commences in response to a signal from cell 44 which is generated when the cell detects the leading edge of the trailer downstream of the shear. The existing control 22 provides automated operation during an order change in the cut-to-length mode only. Automated order change in the cut-to-mark mode is not possible without the present invention.

The invention substitutes the target 26 for the leading edge of the trailer, and it substitutes the tracking signal from counter 34 for the signal generated by cell 44. The logic control 22 therefore tracks the target 26 instead of the leading edge of the trailer. As a result, the cut-off knives automatically begin to cut the trailer at the target, i.e. at the first registration mark on the trailer. Since the mark will be within the optical sensor "window", the cut-off machine 20 automatically operates in the cut-to-mark mode in synchronization with all following registration marks on the trailer.

The invention utilizes commercially available components which are few in number and which are arranged so as to implement the existing logic control 22 but in a manner to effect cut-to-mark operation without losing synchronization due to a transition between first and second sets of registration marks.

Although the invention has been described in terms of automated order change in the cut-to-mark mode, it should be appreciated that the invention is more broadly directed to preserving cut-to-mark operation of the cut-off knives despite a transition between the first and second sets of registration marks. The invention encompasses synchronization between the optical sensor "windows" and two sets of like registration marks across a transition such as a splice, wherein there is a single order and no order change. The splice is made necessary by a roll-to-roll change within the order.

B. Roll-To-Roll Change Within An Order

Figure 5:
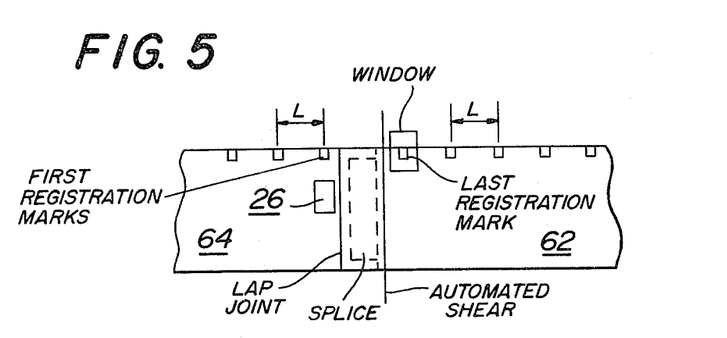
FIG. 5 is a diagrammatic view of a moving web comprising spliced pre-printed portions to be cut into blanks in accordance with the present invention for a roll-to-roll change within an order.

The web 10 may be pre-printed, bearing like registration marks separated by a splice as shown in FIG. 5. In FIG. 5, the old roll web or leader is designated 62 and the new roll web or trailer is designated 64. The target 26 is applied to the new roll web 64 adjacent the first registration mark on the web.

For operation during a roll-to-roll change within an order, synchronization between the optical sensor "windows" and registration marks would be lost as the splice (transition) traverses the optical sensor. That is, as the splice passes the optical sensor, the first registration mark on the trailer 64 does not coincide with an optical sensor "window" due to the non-uniform spacing between the last registration mark of the leader 62 and the first registration mark of the trailer 64. Accordingly, the control 22 reverts automatically to the cut-to-length mode wherein the knives cut the trailer based on the keyboard entry of desired blank length L and wherein the control 22 periodically enables the optical sensor for a time "window" each time that the count of measuring wheel encoder pulses reaches the length L. The operator must initiate an upstream or downstream adjust to bring the optical sensor "windows" back into synchronization with the registration marks on the new roll web 64. Many waste sheets having truncated pre-printed material can be cut before synchronization is re-established.

Operation in the cut-to-mark mode during a roll-to-roll change within an order is identical to that already described in connection with the automated order change. Thus, the shear 16 is automatically fired by counter 32 to sever the web 10 immediately downstream of the splice into the leader and trailer. The leader is cut into blanks by the cut-off knives which are operating in the cut-to-mark mode. A gap is created between the leader and trailer to afford the cut-off machine 20 sufficient time to "cock" the cut-off knives before the trailer, and in particular the target 26, reaches the cut-off machine. When the cut-off machine is "in the gap", the knives are "cocked". Thereafter, the trailer is "crop" cut at the target, i.e., at the first registration mark, and the cut-off knives cut the trailer in the cut-to-mark mode in synchronization with all following registration marks.

Although the invention has been described in connection with an automated order change and a roll-to-roll change within an order wherein a gap is created between the leader and trailer, the invention also has application in a no-gap type order change system.

C. No-Gap Type Order Change

Figure 6:
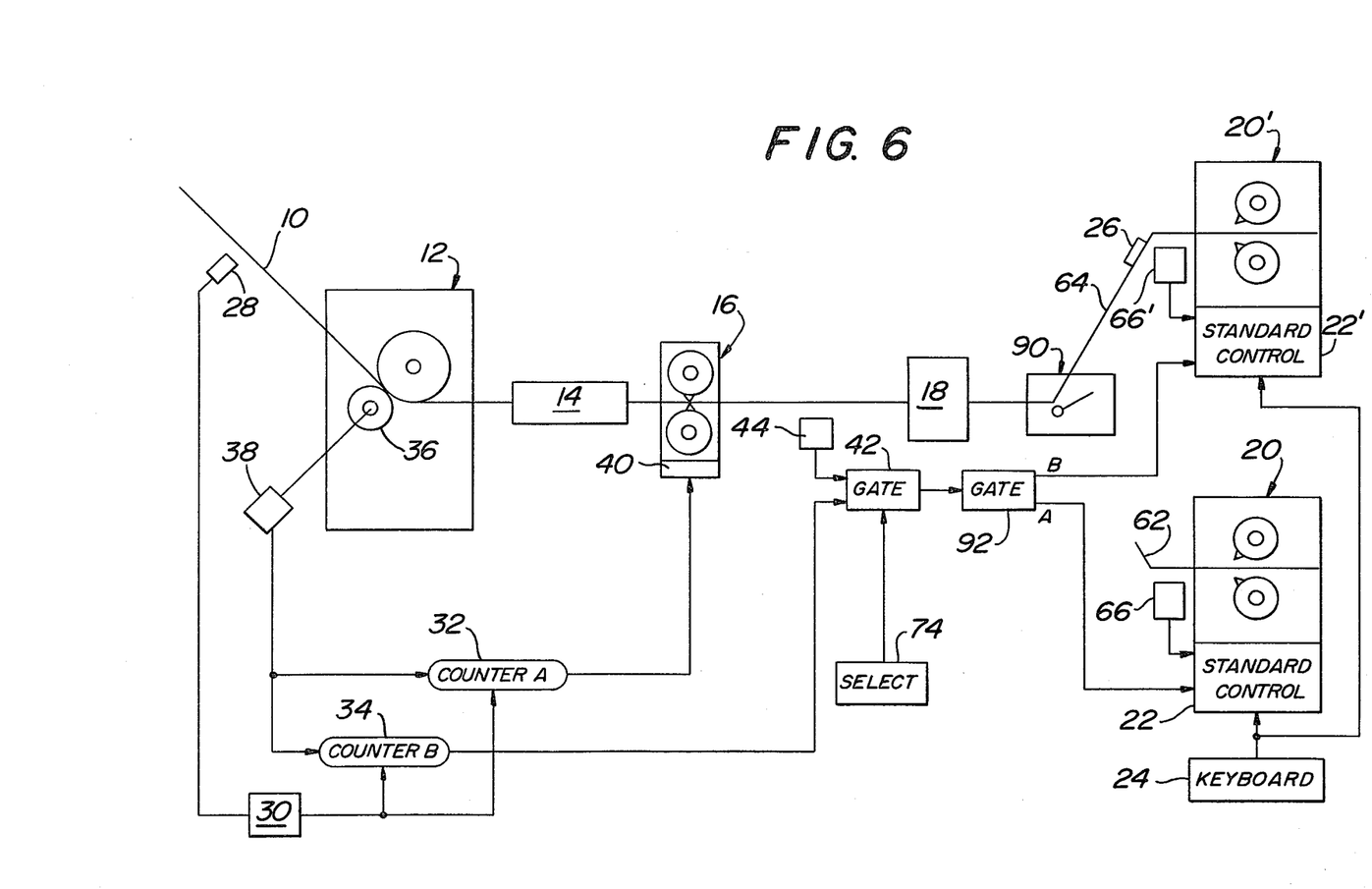
FIG. 6 is a block diagram of the invention in use with two cut-off machines of a no-gap order change system.

In a no-gap order change system, as in a gap type system, the web must be severed to separate the old and new orders. In a no-gap system, however, the web 10 moves at high speed before and after traversing the shear 16; and instead of creating a gap by accelerating the leader and then feeding the leader and trailer to the same cut-off machine, the leader is cut by one cut-off machine 20 while the trailer is directed automatically to a second identical cut-off machine 20' as shown in FIG. 6. Both machines 20 and 20' are B type machines as previously described. Before the trailer reaches the second cut-off machine 20', the machine generates sensor "windows" as in the cut-to-length mode, i.e., based on the input of new order blank length from keyboard 24 which may actually comprise two keyboards, one for each cut-off machine.

The counters 32 and 34 operate as in the gap type order change, to track the target 26 from sensor 28 to shear 16 and cell 44. When the target is tracked to shear 16, the shear knives are fired automatically by shear control 40 to sever the web 10 into the leader 62 and trailer 64. The trailer is diverted in conventional manner by a diverter mechanism 90 to the second cut-off machine 20'.

When the target is tracked to cell 44, the gate 42 toggles a gate 92, which is a bi-stable device having complementary outputs A and B, in response to the tracking signal output of counter 34. The control 22 tracks the trailing edge of the leader 62 to machine 20, and it causes the machine 20 cut-off knives to cut the last blank from the leader and then "cock" in preparation for a "crop" cut of the trailer 64. The trailer, however, is diverted to the cut-off machine 20'. The machine 20 cut-off knives therefore remain "cocked" until the output A of gate 92 assumes a complementary vale when the gate is again toggled at the next order change.

While the control 22 maintains the machine 20 knives in the "cocked" position in response to output A of gate 92, the control 22' tracks the target 26 from cell 44 to cut-off machine 20' in response to the complementary output B of gate 92. When the target 26 reaches cut-off machine 20', the cut-off knives are operated to "crop" cut the trailer 64 at the target, i.e., at the first registration mark on the trailer. Thereafter, the cut-off knives are operated by control 22' in the cut-to-mark mode to cut the trailer into blanks at all following registration marks.

At the next order change or operation of shear 16, the next target is tracked to cell 44 in the manner already described, and the counter 34 output is passed by gate 42 to toggle gate 92, reversing the complementary outputs A and B. The control 22' "cocks" the machine 20' cut-off knives, and the control 22 tracks the target to machine 20 and operates the machine 20 cut-off knives to "crop" cut the new trailer at the target. Transfer of operation between the two cut-off machines 20 and 20' occurs in the manner described at each subsequent order change or operation of shear 16.

It should be noted that the invention is directed to cut-to-mark operation of a cut-off machine 20 or cut-off machines 20 and 20' during order changes or roll-to-roll changes. Although the cell 44 is used by the standard control 22 (or 22') in standard cut-to-length and cut-to-mark operation, the cell is never used in cut-to-mark operation according to the present invention. Thus, gate 42 is always conditioned by select switch 74 to block the cell 44 output and pass instead the output of counter 34 when practicing the method of the invention.

The present invention may be embodied in other specific forms without departing from the spirit or essential attributes thereof and, accordingly, reference should be made to the appended claims, rather than to the foregoing specification, as indicating the scope of the invention.

I claim:

1. A method of automatically controlling a cut-off machine having knives operable in a cut-to-mark mode wherein the knives cut a moving web divisible into a leader having a first set of registration marks and a trailer having a second set of registration marks, there being a transition between the first and second sets of marks, comprising:
   (a) applying a target to the trailer adjacent a preselected registration mark of the second set;
   (b) tracking the target electronically to a shear upstream of the cut-off machine;
   (c) automatically severing the web transversely at the shear into a leader and trailer when the target is tracked to the shear;
   (d) tracking the target electronically from said shear to a position intermediate the shear and said cut-off machine;
   (e) causing the kinves to cut the trailer automatically at the preselected registration mark of the second set; and
   (f) causing the knives to cut the trailer automatically in the cut-to-mark mode at the registration marks of the second set which follow said preselected registration mark.

2. The method in accordance with claim 1 wherein the preselected registration mark is the first mark of the second set.

3. The method in accordance with claim 1 wherein said target is a magnetically detectable target.

4. A method of automatically controlling at least first and second cut-off machines each having knives operable in a cut-to-mark mode wherein the knives cut a moving web divisible into a leader having a first set of registration marks and trailer having a second second of registration marks, there being a transition between the first and second sets of marks, comprising:
   (a) applying a target to the trailer adjacent a preselected registration mark of the second set;
   (b) tracking the target electronically to a shear upstream of the cut-off machines;
   (c) automatically severing the web transversely at the shear into a leader and trailer when the target is tracked to the shear;
   (d) directing the leader to said first cut-off machine;
   (e) causing the knives of said first cut-off machine to cut the leader in the cut-to-mark mode at the registration marks of the first set;
   (f) tracking the target electronically from said shear to a position intermediate the shear and said cut-off machines;
   (g) directing the trailer to said second cut-off machine;

(h) causing the knives of said second cut-off machine to cut the trailer automatically at the preselected registration mark of the second set; and (i) causing the knives of said second cut-off machine to cut the trailer automatically in the cut-to-mark mode at the registration marks of the second set which follow said preselected registration mark.

5. The method in accordance with claim 4 wherein said target is a magnetically detectable target.

6. The method in accordance with claim 4 wherein the preselected registration mark is the first mark of the second set.

7. Apparatus for automatically controlling a cut-off machine having knives operable in a cut-to-mark mode wherein the knives cut a moving web divisible into a leader having a first set of registration marks and trailer having a second set of registration marks, there being a transition between the first and second sets of marks, said trailer being provided with a target adjacent a preselected registration mark of the second set, comprising:

(a) a shear upstream of said cut-off machine for severing the web transversely into a leader and trailer;

(b) means for tracking said target electronically to said shear and for causing said shear to sever the web into said leader and trailer when said target is tracked to said shear;

(c) means for tracking the target electronically from said shear to a position intermediate the shear and said cut-off machine; and (d) means for causing said knives to repetitively cut the trailer at said second set of registration marks in the cut-to-mark mode beginning at the position of said preselected registration mark.

8. Apparatus in accordance with claim 7 wherein said target is a magnetically detectable target and said means for tracking the target to the shear includes a magnetic sensor.

9. Apparatus in accordance with claim 7 including means for causing said knives to cut the leader in the cut-to-mark mode at said first set of registration marks, and means for creating a gap between the leader and trailer as the target is tracked from said shear to said position intermediate the shear and said cut-off machine.

10. Apparatus for automatically controlling at least first and second cut-off machines each having knives operable in a cut-to-mark mode wherein the knives cut a moving web divisible into a leader having a first set of registration marks and a trailer having a second set of registration marks, there being a transition between the first and second sets of marks, said trailer being provided with a target adjacent a preselected registration mark of the second set, comprising:

(a) a shear upstream of said cut-off machine for severing the web transversely into a leader and trailer;

(b) means for tracking said target electronically to said shear and for causing said shear to automatically sever the web transversely into said leader and trailer when said target is tracked to said shear;

(c) means for directing the leader to said first cut-off machine;

(d) means for causing the knives of said first cut-off machine to cut the leader in the cut-to-mark mode at the registration marks of the first set;

(e) means for tracking the target from said shear to a position intermediate the shear and said cut-off machines;

(f) means for directing the trailer to said second cut-off machine; and (g) means for causing the knives of said second cut-off machine to repetitively cut the trailer at said second set of registration marks in the cut-to-mark mode beginning at the position of said preselected registration mark.

11. Apparatus according to claim 10 including means for alternately cocking the knives of one of said first and second cut-off machines while causing the knives of the other of said cut-off machines to cut the trailer.

* * * * *